United States Patent [19]
Noethen et al.

[11] Patent Number: 5,255,015
[45] Date of Patent: Oct. 19, 1993

[54] ATHERMALLY COMPENSATED OPTICAL HEAD FOR A LASER SCANNER

[75] Inventors: Mark L. Noethen; Bradley S. Jadrich, both of Rochester; Steven F. Entz, Brockport, all of N.Y.

[73] Assignee: Eastman Kodak Company, Rochester, N.Y.

[21] Appl. No.: 896,089

[22] Filed: Jun. 3, 1992

[51] Int. Cl.$^5$ .............................................. H01S 3/04
[52] U.S. Cl. .................................. 346/108; 359/641; 359/820; 372/34
[58] Field of Search .............. 346/108, 76 L; 359/641, 359/820; 372/33-36

[56] References Cited

U.S. PATENT DOCUMENTS

| | | | |
|---|---|---|---|
| 4,297,713 | 10/1981 | Ichikawa et al. | 346/108 |
| 4,498,737 | 2/1985 | Doggett | 362/191 |
| 4,641,023 | 2/1987 | Ando et al. | 250/216 |
| 4,720,168 | 1/1988 | Kaneko | 350/353 |
| 4,815,059 | 3/1989 | Nakayama et al. | 369/45 |
| 4,855,987 | 8/1989 | Versluis | 369/112 |
| 4,861,137 | 8/1989 | Nagata | 359/820 |
| 4,918,702 | 4/1990 | Kimura | 372/34 |
| 4,948,221 | 8/1990 | Yates | 385/53 |
| 4,961,079 | 10/1990 | Owens et al. | 346/108 |
| 4,993,801 | 2/1991 | Sarraf | 359/641 |
| 5,029,335 | 7/1991 | Fisher et al. | 372/36 |

FOREIGN PATENT DOCUMENTS 0323850 7/1989 European Pat. Off. .

Primary Examiner—Joan H. Pendegrass
Attorney, Agent, or Firm—Robert L. Randall

[57] ABSTRACT

An athermally compensated printhead includes a laser diode having predetermined characteristics for generating a beam of light, a diode mount, cooling means, a collimator lens, and a len mount. The diode mount is formed of a predetermined material with a predetermined coefficient of thermal expansion for mounting the laser diode in the printhead. The cooling means is used to maintain the laser diode at a substantially constant operating temperature for longer life and to avoid wavelength changes. The collimator lens has characteristics which provide predetermined changes in focal length versus changes in ambient temperature over a predetermined temperature range. The len mount is formed of a predetermined material having a predetermined coefficient of thermal expansion for mounting the collimator lens adjacent a first major surface of the diode mount to receive the beam of light from the laser diode. The predetermined coefficient of thermal expansion of the material of the lens mount is chosen to compensate for the changes in focal length of the collimator lens versus changes in ambient temperature over the predetermined temperature range.

15 Claims, 2 Drawing Sheets

ATHERMALLY COMPENSATED OPTICAL HEAD FOR A LASER SCANNER

FIELD OF THE INVENTION

The present invention relates to optical heads for laser scanners that compensate for changes in a diode laser and a lens caused by changes in ambient temperature.

BACKGROUND OF THE INVENTION

In a laser system in which a diode laser and a collimating lens is used, ambient temperature changes cause the laser, lens, and the mounts therefor to expand or contract or otherwise change the characteristics thereof. This causes a net change in focus of a laser beam on a print medium (e.g., thermal dye transfer medium, etc.) or other end surface of the laser beam. It is desirable to maintain the focus over a predetermined temperature range for normal laser printing operations. Various techniques have been developed for maintaining the focus of a laser and lens combination over a predetermined temperature range.

U.S. Pat. No. 4,641,023 (H. Ando et al.), issued on Feb. 3, 1987, discloses an optical head for an optical disc wherein a semiconductor laser is supported on a base which is secured to a hollow frame. A lens-barrel for supporting a collimator lens system is disposed in the hollow frame so that the collimator lens system faces the laser. The distance between the collimator lens system and the semiconductor laser is allegedly maintained although the disclosure incorrectly states that the distance that is maintained constant is between the front focal plane and the semiconductor laser. The problem with this arrangement is that the front focal plane of the lens changes with temperature which is not taken into account.

U.S. Pat. No. 4,720,168 (Y. Kaneko), issued on Jan. 19, 1988, discloses a laser beam collimating apparatus comprising a semiconductor laser, a collimating lens, and a support for holding the laser and the lens at a predetermined distance from each other. The material of the support is stated as having a linear expansion coefficient which can cancel out a deviation of the focal distance of the collimator lens due to a wavelength change of the semiconductor laser over temperature. More particularly, the wavelength change of the semiconductor laser induces a focal length change of the lens which is compensated for by the material chosen. However, the remaining problem is that this does not take into account how the lens itself changes with temperature.

U.S. Pat. No. 4,815,059 (M. Nakayama et al.), issued on Mar. 21, 1989, discloses a device comprising a semiconductor laser for emitting a laser beam, a coupling lens for collimating the laser beam, and a support member for supporting the laser and the coupling lens. The support member is structured so that the focal distance of the coupling lens varies in accordance with a change in wavelength of the laser beam caused by a change in ambient temperature. The problem with this device is that the design of the device is fixed because a particular lens is used which is designed specifically for the device.

U.S. Pat. No. 4,948,221 (T. Yates), issued on Aug. 14, 1990, discloses an athermalized optical head comprising a light source (e.g., a laser diode), and an optical element (e.g., a collimator lens). The light source and the optical element are mounted along a common axis, and a thermoelectric cooling element is provided in the optical head to control the temperature of the light source. The distance between the light source and the optical element is maintained constant over a predetermined temperature range to maintain a spot produced by the head in focus. A problem with this optical head is that the design tries to maintain the distance constant between the light source and the collimator lens even though changes occur in the collimator lens with changes in temperature.

U.S. Pat. No. 4,993,801 (S. Sarraf), issued on Feb. 19, 1991, discloses an optical head comprising a light source (e.g., a laser diode) and an optical element (e.g., a collimating lens). The light source and the optical element are mounted along a common optical axis, and a thermoelectric cooling element is provided in the head to control the temperature of the light source. To precisely locate the optical element relative to the light source, a housing of the optical element is mounted directly onto a barrel of the light source. A problem with this optical head (as with the Yates patent above) is that the design tries to maintain the distance constant between the light source and the collimator lens.

It is desirable to provide an athermally compensated printhead which is simple and inexpensive to manufacture, is able to compensate for various effects due to ambient temperature changes and maintain the focus of a laser beam over a predetermined temperature range, and is able to use any one of the commercially available laser diodes and lenses.

SUMMARY OF THE INVENTION

The present invention is directed to an athermally compensated optical printhead for laser scanners which is simple and inexpensive to manufacture, is able to compensate for various effects due to ambient temperature changes and maintain the focus of a laser beam over a predetermined temperature range, and is able to use any one of the commercially available laser diodes and lenses.

Viewed from one aspect, the present invention is directed to an athermally compensated printhead comprising a laser diode having predetermined characteristics for generating a beam of light, a diode mount, cooling means, a collimator lens, and a len mount. The diode mount is formed of a predetermined material with a predetermined coefficient of thermal expansion for mounting the laser diode in the printhead. The cooling means is used to maintain the laser diode at a substantially constant operating temperature. The collimator lens has characteristics which provide predetermined changes in focal length versus changes in ambient temperature over a predetermined temperature range. The lens mount is formed of a predetermined material having a predetermined coefficient of thermal expansion for mounting the collimator lens adjacent a first major surface of the diode mount to receive the beam of light from the laser diode. The predetermined coefficient of thermal expansion of the material of the lens mount is chosen to have a value that compensates for the changes in focal length of the collimator lens versus changes in ambient temperature over the predetermined temperature range.

Viewed from another aspect, the present invention is directed to an athermally compensated printhead comprising a laser diode having predetermined characteristics for generating a beam of light, a diode mount, cooling means, a collimator lens, and a lens mount as described hereinabove. Additionally, the printhead comprises an affixing means, and the diode mount comprises adjusting means comprising a first edge, a second edge, and a third edge of the diode mount. The affixing means functions to fix the position of the diode mount and the lens mount relative to each other after the laser diode and the collimator lens are properly aligned along a longitudinal axis of the collimator lens. The first edge of the diode mount is used to move the diode mount in an X direction by a force from an external means to align the laser diode and the collimator lens in the X direction. The second edge of the diode mount is used to move the diode mount in a Y-direction orthogonal to the X direction by a force from a second external means to align the laser diode and the collimator lens in the Y direction. A third external means provides a force on the collimator lens to move the collimator lens in a Z direction orthogonal to the X and Y directions to effect focussing of the collimator lens in the Z direction. The forces from the first, second, and third external means are removed once the affixing means fixes the aligned positions of the laser diode, the diode mount, and the lens mount, and the aligned and focused collimator lens is secured in the lens mount.

The invention will be better understood from the following more detailed description taken with the accompanying drawings and claims.

The drawings are not necessarily to scale.

DETAILED DESCRIPTION

It is to be understood hereinafter that corresponding elements in the various figures have the same designation numbers and functions.

Figure 1:
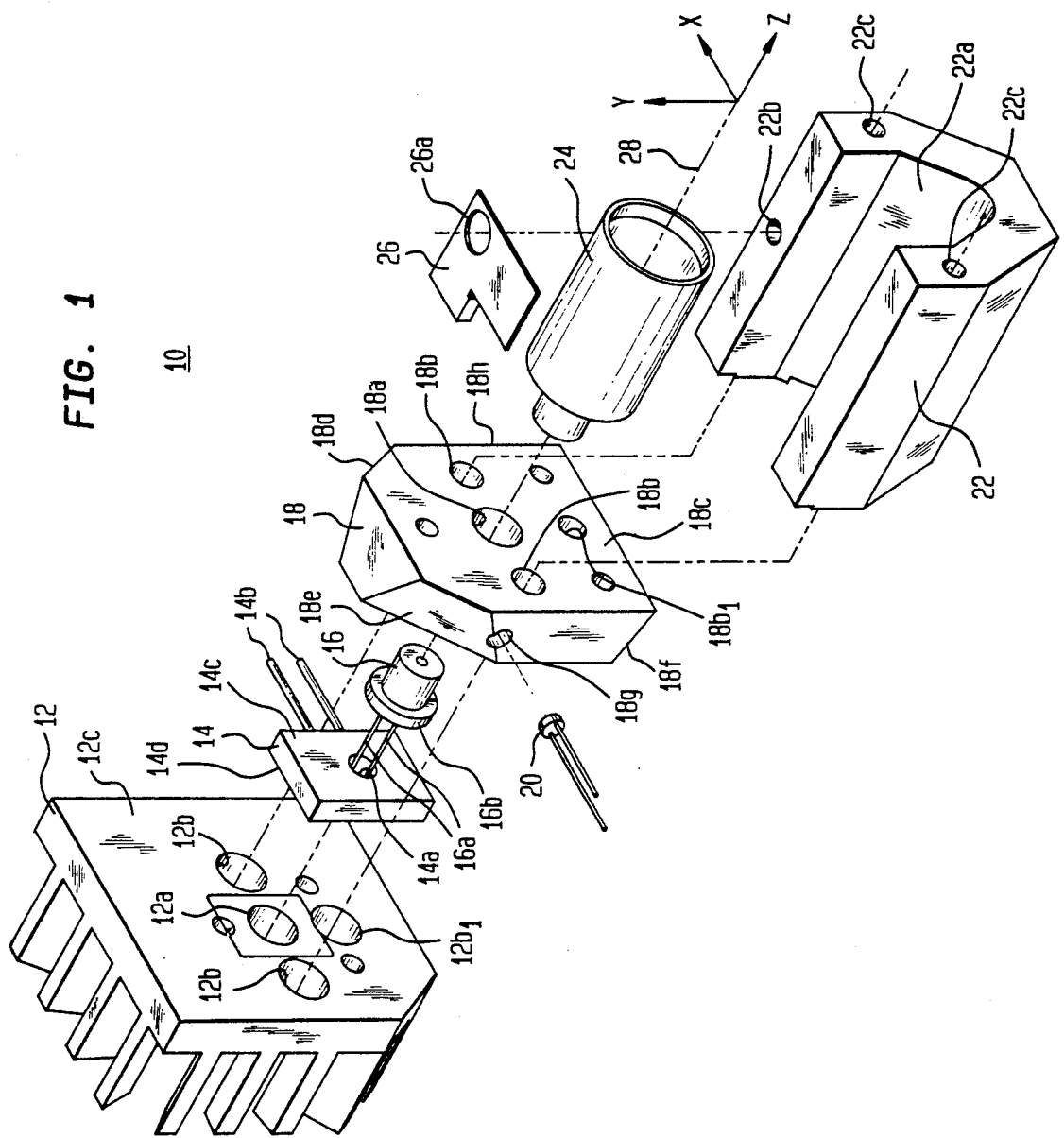
FIG. 1 is an isometric view of elements forming an athermally compensated printhead for laser scanners in accordance with the present invention.

Referring now to FIG. 1, there is shown an isometric view of elements forming an athermally compensated printhead 10 for laser scanners in accordance with the present invention. The printhead 10 comprises a heatsink 12, a thermoelectric cooler 14, a laser diode 16 comprising a pair of electrical conductors 16a and a back surface 16b, a diode mount 18, a thermistor 20, a lens mount 22, a collimator lens 24, a retaining spring 26 for holding the collimator lens 24 in the lens mount 22 with the retaining spring 26 defining an opening 26a therethrough, and a longitudinal axis 28 of both the printhead 10 and the collimator lens 24. The heatsink 12 defines a first opening 12a, a pair of second openings 12b, and has a front surface 12c. The thermoelectric cooler 14 defines an opening 14a through the center thereof, and has a pair of electrical conductors 14b for providing current to the thermoelectric cooler 14, a front surface 14c, and a back surface 14d.

The diode mount 18 is made of a first predetermined material in accordance with a first embodiment of the present invention, and defines a first opening 18a through a center thereof, and a pair of second openings 18b which are aligned with the pair of second openings 12b of the heatsink 12. The diode mount 18 further comprises a front surface 18c, a second surface 18d cut perpendicular to the front surface 18c across a first top corner of the diode mount 18, a third surface 18e cut with an slope which is directed inwardly towards the longitudinal axis 28 from the front surface 18c across a second top corner of the diode mount 18, a fourth surface 18f cut with an inwardly-directed slope away from the front surface 18c and across a bottom edge of the diode mount 18, a hole 18g, and a side edge 18h. The thermistor 20 is mounted in the hole 18g in the diode mount 18 for providing control signals to a power supply (not shown) supplying current to the thermoelectric cooler 14 via the electrical conductors 14b to maintain the temperature of the laser diode 16 substantially constant over a predetermined temperature range.

The lens mount 22 is formed of a second predetermined material in accordance with the first embodiment of the present invention which preferably corresponds to the first predetermined material of the diode mount 18. The lens mount 22 defines a V-shaped groove 22a for supporting the collimator lens 24, a first threaded opening 22b for mounting the retaining spring 26 to fixedly mount the collimator lens 24 in the V-shaped groove 22a, and a pair of second openings 22c which are aligned with both the pair of second openings 18b of the diode mount 18 and the pair of second openings 12b of the heatsink 12.

In assembling the printhead 10, the laser diode 16 is positioned in the first opening 18a in the center of the diode mount 18 so that a light beam from the laser diode 16 has its central ray substantially directed along the longitudinal axis 28 of the printhead 10. The front surface 14c of the thermoelectric cooler 14 is placed in contact with a back surface 16b of the laser diode 16 with the pair of electrical conductors 16a from the laser diode 16 protruding through the central opening 14a of the thermoelectric cooler 14. The diode mount 18, with the laser diode 16 and thermoelectric cooler 14 positioned thereon, is placed on the heatsink 12 so that the back surface 14d of the thermoelectric cooler 14 contacts the front surface 12c of the heatsink 12. The pair of electrical conductors 16a from the laser diode 16 protrude through the first opening 12a in the center of the heatsink 12 for supplying power to the laser diode 16.

A separate bolt (not shown) is inserted through each of the pair of second openings 12b of the heatsink 12, then through the corresponding openings 18b of the diode mount and into (where screw threads are used) or through (where nuts are used) the corresponding pair of openings 22c of the lens mount 22 so that the heatsink 12, the diode mount 18 and the lens mount 22 are loosely held together. It is to be understood that an additional bolt can be used that protrudes through the opening $12b_1$ shown below the opening 12a of the heatsink 12, then through a corresponding opening $18b_1$ below the opening 18a in the diode mount 18, and then into a corresponding opening (not shown) in the lens mount 22. The pair of second openings 18b (and the opening $18b_1$, if used) in the diode mount 18 have a diameter which is greater than the diameter of the bolts (not shown) going therethrough in accordance with a second embodiment of the present invention. This permits the diode mount 18 to be selectively moved in X and Y orthogonal directions, in reference to the longitudinal axis 28 of the printhead 10, to align the diode laser 16 and the axis 28 of the collimator lens 24. Additionally, selective movement of the collimator lens 24 in the lens mount 22 in the Z direction permits an adjustment of the focus of a light beam from the laser diode 16 onto a predetermined plane (not shown) before the elements of the printhead 10 are fixedly secured by tightening the bolts (not shown).

The collimator lens 24 is placed into the V-groove 22a of the lens mount 22 and the retaining spring 26 is mounted thereon via a bolt (not shown) through opening 26a of the retaining spring 26 and into the first threaded opening 22b of the lens mount 22 to hold the collimator lens in a fixed position in the lens mount 22. It is to be understood that the collimator lens 24 preferably does not protrude into the central opening 18a of the diode mount 18 where the laser diode 16 is inserted or touch the diode mount 18. This permits the selective adjustments of the diode mount 18 in the X and Y directions to achieve the alignment of the laser diode 16 and the collimator lens 24. The light beam is then focused onto the predetermined plane (not shown) by moving the collimator lens 24 in the lens mount 22 in the Z direction with respect to the aligned laser diode 16 before the retaining spring 26 is tightened to fixedly position the collimator lens 24 in the lens mount 22 relative to the laser diode 16.

Figure 2:
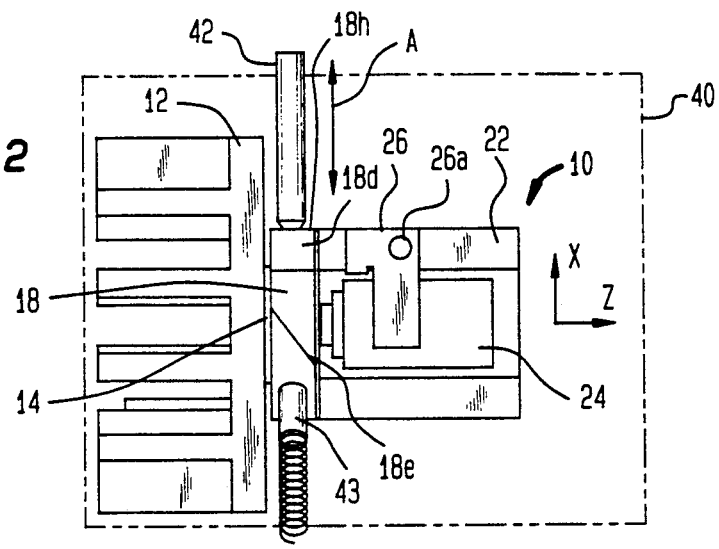
FIG. 2 is a top view of the printhead of FIG. 1 positioned in an external fixture for aligning a laser diode with a lens in an X-Z direction in the printhead in accordance with the present invention.
Figure 3:
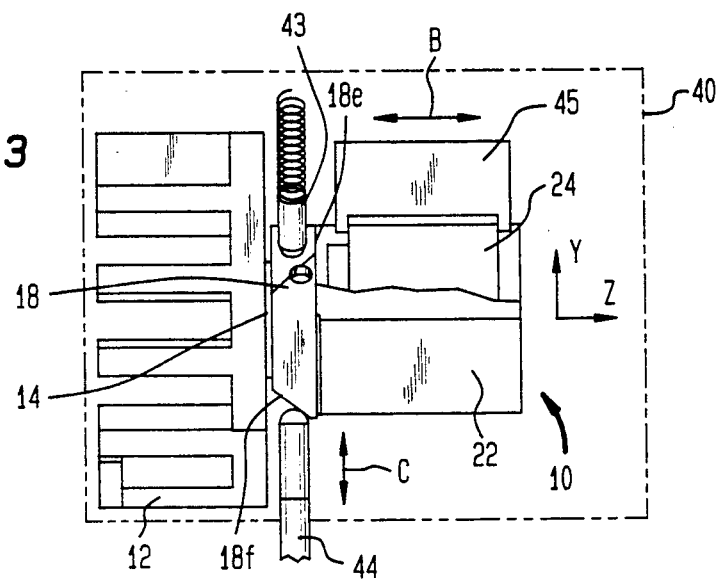
FIG. 3 is a side view of the printhead of FIG. 1 positioned in an external fixture for aligning a laser diode with a lens in an Y-Z direction in the printhead in accordance with the present invention.
Figure 4:
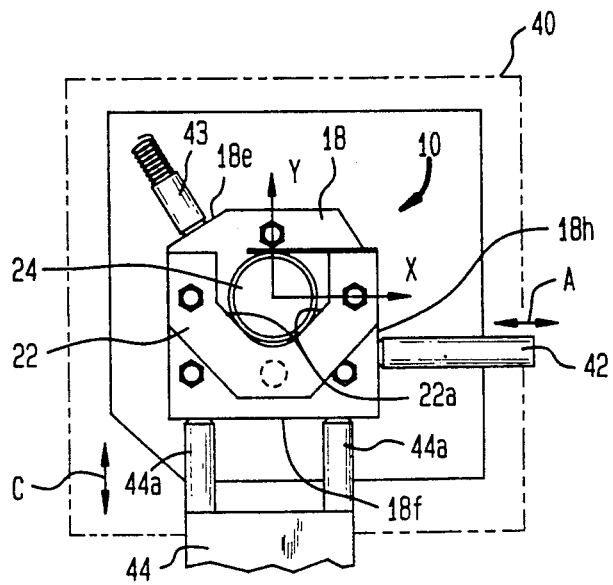
FIG. 4 is a front view of the printhead of FIG. 1 positioned in an external fixture for aligning a laser diode with a lens in an X-Y direction in the printhead in accordance with the present invention.

Referring now to FIGS. 2, 3, and 4, there are shown a top, side, and front view, respectively, of the assembled printhead 10 in an external fixture 40 (shown within a dashed line rectangle). The external fixture 40 comprises first, second, and third aligning means 42 (shown in FIGS. 2 and 4), 43, and 44 (shown in FIGS. 3 and 4), respectively, contacting the diode mount 18 of the printhead 10 for aligning the diode laser 16 (shown in FIG. 1) with the longitudinal axis 28 (shown in FIG. 1) of the collimator lens 24, and a collimator lens moving fixture 45. The second aligning means 43 contacts the sloped surface 18e of the diode mount 18 and is spring loaded for providing a selective force on the diode mount 18 in each of the X and Y directions. The first aligning means 42 contacts the side edge 18h of the diode mount 18 for selectively moving the diode mount 18 in the X direction indicated by arrow A in FIGS. 2 and 4 in opposition to the X-direction force applied by the second aligning means 43. The third aligning means 44 comprises a pair of spaced-apart contacting posts 44a which contact the sloped bottom surface 18f of the diode mount 18 for selectively moving the diode mount 18 in the Y direction as indicated by the arrow C in FIGS. 3 and 4 in opposition to the Y-direction force applied by the second aligning means 43. The collimator lens moving fixture 45 is used to selectively move the collimator lens 24 in the Z direction as indicated by the arrow B in FIG. 3 to focus the light beam from the laser diode 16 at a predetermined plane (not shown).

In operation, the assembled printhead 10 of FIG. 1 is installed in the external fixture 40 with the first, second, and third aligning means 42, 43, and 44 contacting the edge surfaces 18h, 18e, and 18f, respectively, of the diode mount 18, and the collimator lens moving fixture 45 engages the collimator lens 24. The first and third aligning means 42 and 44, respectively, are selectively moved to align the diode laser 16 with the longitudinal axis 28 of the collimator lens 24. The collimator lens moving fixture 45 is then selectively moved in the Z direction to move the collimator lens 24 until the light beam from the laser diode 16 is focused at a predetermined plane (not shown). The collimator lens 24 is then fixedly positioned in the lens mount 22 by tightening the retaining spring 26. The bolts (not shown) extending through the openings 12b (of the heatsink 12), 18b (of the diode mount 18), and 22c (of the lens mount 22) of the assembled printhead 10 are tightened. This fixedly sandwiches the diode mount 18 and the laser diode 16 between the heatsink 12 and the lens mount 22, and fixedly maintains the laser diode 16 in alignment with axis 28 of the collimator lens 24. It is to be understood that the diode mount 18 and the lens mount 22 can be fixedly maintained in their positions by any suitable means other than bolts as, for example, by an adhesive. The printhead 10 is then removed from the external fixture 40 for installation in a laser printer It is to be understood that as the collimator lens 24 is subjected to ambient temperature changes, the focal length thereof changes. Rather than trying to maintain a fixed distance between the laser diode 16 and the collimator lens 24, as found in the prior art, the material of the lens mount 22 is selected to compensate for changes of focal length of the lens 24 due to ambient temperature changes in accordance with the first embodiment of the present invention. In other words, the material of the lens mount 22 is selected to expand or contract in a manner to compensate for changes in focal length of the collimator lens 24 due to changes in temperature over a predetermined temperature range.

A process of selecting a best material for the lens mount 22 in accordance with the first embodiment of the present invention is as follows. In a first step, any commercially available laser diode 16 (e.g., a Hitachi Model 8315E laser diode), and any commercially available collimator lens 24 (e.g., an Olympus Model 8650 lens) is chosen. The chosen laser diode 16 and collimator lens 24 are mounted in a calibration printhead (not shown) which is similar to the printhead 10 of FIG. 1. The collimator lens 24 is initially calibrated to derive a direction and a magnitude of a shift in focus for longitudinal translations of the chosen collimator lens 24. This is performed using a sensitive focus measuring gauge (not shown), and a substantially precise translation stage (not shown) for deliberately defocussing the collimator lens 24 along the longitudinal axis 28 of the collimator lens 24. This provides a precise distance that the collimator lens 24 has moved from an initial focused position from the diode laser 16.

More particularly, without changing the ambient temperature of the collimator lens 24, the collimator lens 24 is moved longitudinally in a predetermined direction (towards or away from the diode laser 16) by a precise translation distance using the substantially precise translation stage (not shown). A measurement is then made of the amount the collimator lens 24 is defocused relative to such precise translation distance using the sensitive focus measuring gauge. A plurality of such measurements are made for different translation distances of the collimator lens 24 from the laser diode 16 over a predetermined translation distance range. The plurality of such measurements are plotted to obtain a linear curve (not shown) of changes in focus of the collimator lens 24 versus actual translation distances of the collimator lens 24. This provides a calibration of the characteristics of focal changes versus translation distance changes for the chosen collimator lens 24.

In a second step for selecting the best material for the lens mount 22, the laser diode 16 and the collimator lens 24 are properly aligned in the diode mount 18 and the lens mount 22, respectively, of a test printhead 10 as described hereinbefore using the external fixture 40. Additionally, the bolts (not shown) extending through the openings 12b (of the heatsink 12), 18b (of the diode mount 18), and 22c (of the lens mount 22) of the test printhead 10 are tightened to prevent the aligned diode mount 18 and lens mount 22 from moving relative to each other. For purposes of explanation hereinafter, it is assumed that the diode mount 18 and the lens mount 22 have a predetermined thickness, and are made of a predetermined material (e.g., epoxy/carbon) with a known coefficient of thermal expansion.

The test printhead 10 is placed in an oven (not shown) and measurements are made of changes in focus versus ambient temperature changes over a predetermined temperature range (e.g., 20 degrees). From the measured data, a peak-to-peak change in focus in a particular direction of motion of the collimator lens 24 is derived over the predetermined temperature range. From the measured peak-to-peak change in focus, a change of optical distance (e.g., in microns) between the laser diode 16 and the collimator lens 24 is obtained from a correlation with the calibration data obtained for the collimator lens 24 in the first step described hereinabove. For example, for a diode mount 18 and a lens mount 22 made of a material with a very small coefficient of thermal expansion (such as epoxy/carbon) with a predetermined thickness, a 3.3 micron peak-to-peak change of decreasing (negative) optical distance between the laser diode 16 and the collimator lens 24 is derived over the 20 degree maximum temperature range. It is to be understood that the collimator lens 24 is the main contributor in producing the peak-to-peak change in optical distance between the laser diode 16 and the collimator lens 24 due to incurred temperature changes.

In a third step for selecting the best material for the lens mount 22, if the peak-to-peak change value (e.g., 3.3 microns) derived in the second step is too large, at least the material of the lens mount 22 and the diode mount 18 is changed to reduce such peak-to-peak value to as low a level as is reasonably possible. More particularly, the first two steps provided data of the amount the optical distance changed (e.g., 3.3 microns) between the laser diode 16 and the collimator lens 24, and the direction of optical distance change (towards or away from the laser diode 16) for a material (epoxy/carbon) with a particular coefficient of thermal expansion. With such data, a determination is made that a material is needed with a coefficient of thermal expansion that is "X" times more than the coefficient of thermal expansion of the epoxy/carbon used in the test printhead 10. Such new coefficient of thermal expansion is obtained from a table of materials containing such coefficients. It is to be understood that an exact coefficient of thermal expansion may not be available, in which case a closest coefficient of thermal expansion is chosen. A new printhead 10 is then formed of the new material and tested using the second step described hereinbefore. For example, a material such as Phenolic G-10 provided a peak-to-peak distance change of 1.5 microns over the 20 degree temperature range for the same dimensioned printhead 10 in which epoxy/carbon was used for the diode mount 18 and lens mount 22. The use of the Phenolic G-10 material provided a peak-to-peak change which is reduced by more than two times over that provided with epoxy/carbon.

It is to be understood that for each combination of a particular laser diode 16 and a particular collimator lens 24, the above-described three steps are performed for determining the most suitable material for the diode mount 18 and the lens mount 22. Using a different laser diode 16 and/or a different collimator lens 24 with different parameters requires that the above-described three steps be performed again for determining the most suitable material for the diode mount 18 and the lens mount 22. However, once the most suitable material for the diode mount 18 and the lens mount 22 are found for a particular laser diode 16 and a particular collimator lens 24, the printhead 10 can be manufactured in quantity without performing the three steps again for each manufactured printhead 10. The only thing that is required is assembly of the printhead 10 and the proper alignment of the laser diode 16 and the collimator lens 24 in the external fixture 40 prior to use in a laser printer.

In accordance with the present invention, various advantages are obtained. A first advantage is that the materials of the diode mount 18 and the lens mount 22 are chosen to compensate for internal effects of the laser diode 16 and the collimator lens 24. A second advantage is that the collimator lens 24 can be defocused by a known amount during the alignment with the laser diode 16 in the external fixture 40 to further compensate for the entire opto-mechanical system expansion. A third advantage is that the diode mount 18 and the lens mount 24 may be moldable. A fourth advantage is that the external fixture 40 is used only for alignment of the diode laser 16 and the collimator lens 24. This removes complexity of the parts of the printhead 10 and reduces the cost of the diode mount 18 and the lens mount 22. A fifth advantage is that it is possible to obtain substantial electrical isolation of the laser diode 16 by using certain materials such as Phenolic G-10. A sixth advantage is that with the laser diode 16 mounted in contact with the thermoelectric cooler 14, temperature stability and a maximal life is obtained for the laser diode 16. Additionally, it is to be understood that when the temperature of the laser diode 16 changes, the wavelength of the light produced changes which also affects the focus of the collimator lens 24. Therefore, by maintaining the laser diode 16 at a stable temperature, in addition to providing extended life for the laser diode 10, the variable of wavelength changes versus temperature changes of the laser diode 16 is eliminated from consideration in a design of the printhead 10. A seventh advantage is that with a low thermal conductivity of a material such as Phenolic G-10, heat transfer from the laser diode 16 through the thermoelectric cooler 14 is achieved more efficiently.

It is to be appreciated and understood that the specific embodiments of the invention described hereinabove are merely illustrative of the general principles of the invention. Various modifications may be made by those skilled in the art which are consistent with the principles set forth. For example, the diode mount 18 and the lens mount 22 can be made of different materials. Since the lens mount 22 provides most of the change in distance between the laser diode 16 and the collimator lens 24 due to ambient temperature changes, the material of the lens mount 22 is primarily changed to maximally compensate for focal changes of the collimator lens 24 due to ambient temperature changes.

What is claimed is:

1. An athermally compensated printhead comprising: characteristics for generating a beam of light;
   a diode mount formed of a predetermined material with a predetermined coefficient of thermal expansion for mounting the laser diode in the printhead;
   cooling means for maintaining the laser diode at a substantially constant operating temperature;
   a collimator lens having predetermined changes in focal length versus changes in ambient temperature over a predetermined temperature range; and
   a lens mount formed of a predetermined material with a predetermined coefficient of thermal expansion for mounting the collimator lens adjacent a first major surface of the diode mount to receive the beam of light from the laser diode, the predetermined coefficient of thermal expansion of the material of the lens mount having a value that compensates for the changes in focal length of the collimator lens versus changes in ambient temperature over the predetermined temperature range;
   said predetermined material forming said diode mount and said predetermined material forming said lens mount being selected from the group consisting of:
   a) said material of the lens mount and the diode mount are corresponding materials having the same coefficient of thermal expansion; and
   b) said material of the lens mount and the diode mount are different materials having different predetermined coefficients of thermal expansion.

2. The athermally compensated printhead of claim 1 further comprising a thermistor for measuring the temperature at the diode mount and generating control signals for controlling power to the cooling means for maintaining the laser diode at the substantially constant operating temperature.

3. The athermally compensated printhead of claim 1 further comprising a heatsink disposed in contact with the cooling means adjacent a second major surface of the diode mount opposite the first major surface of the diode mount located adjacent to the lens mount.

4. The athermally compensated printhead of claim 1 further comprising affixing means for fixing the positions of the diode mount and the lens mount relative to each other after the laser diode and the collimator lens are aligned along a longitudinal axis of the printhead.

5. The athermally compensated printhead of claim 4 wherein the affixing means are bolts that protrude through the diode mount and at least partially through the lens mount for fixedly positioning the diode mount and the lens mount together.

6. The athermally compensated printhead of claim 4 wherein the diode mount comprises adjusting means for aligning the laser diode with the collimator lens prior to the affixing means fixing the positions of the diode mount and the lens mount, the adjusting means comprising:
   a first edge of the diode mount for moving the diode mount in an X direction by a force from an external means to effect alignment of the laser diode and the collimator lens in the X direction; and
   a second edge of the diode mount for moving the diode mount in a Y-direction orthogonal to the X direction by a force from a second external means to effect alignment of the laser diode and the collimator lens in the Y direction.

7. The athermally compensated printhead of claim 6 wherein a third external means provides a force on the collimator lens to move the collimator lens in a Z direction orthogonal to the X and Y directions to effect focussing of the collimator lens in the Z direction, where the forces from the first, second, and third external means are removed once the affixing means fixes the aligned positions of the laser diode, the diode mount, and the lens mount, and the aligned and focused collimator lens is secured in the lens mount.

8. The athermally compensated printhead of claim 1 wherein the lens mount comprises:
   a V-shaped groove for supporting the collimator lens; and
   retaining means for fixedly mounting the collimator lens in the V-shaped groove.

9. An athermally compensated printhead comprising;
   a laser diode having predetermined characteristics for generating a beam of light;
   a diode mount formed of a predetermined material with a predetermined coefficient of thermal expansion for mounting the laser diode in a predetermined fixed position in the printhead;
   cooling means for maintaining the laser diode at a substantially constant operating temperature;
   a collimator lens having predetermined changes in focal length versus changes in ambient temperature over a predetermined temperature range;
   a lens mount formed of a predetermined material having a predetermined coefficient of thermal expansion for mounting the collimator lens adjacent a first major surface of the diode mount to receive the beam of light from the laser diode, the predetermined coefficient of thermal expansion of the material of the lens mount having a value that compensates for the changes in focal length of the collimator lens versus changes in ambient temperature over the predetermined temperature range; and
   a heatsink disposed in contact with the cooling means and adjacent a second major surface of the diode mount opposite the first major surface of the diode mount located adjacent the lens mount;
   said predetermined material forming said diode mount and said predetermined material forming said lens mount being selected from the group consisting of:
   a) said material of the lens mount and the diode mount are corresponding materials having the same coefficient of thermal expansion; and
   b) said material of the lens mount and the diode mount are different materials having different predetermined coefficients of thermal expansion.

10. The athermally compensated printhead of claim 9 further comprising a thermistor for measuring the temperature at the diode mount and for generating control signals for controlling power to the cooling means for maintaining the laser diode at the substantially constant operating temperature.

11. The athermally compensated printhead of claim 9 further comprising affixing means for fixing the positions of the diode mount and the lens mount after the laser diode and the collimator lens are properly aligned along a longitudinal axis of the printhead.

12. The athermally compensated printhead of claim 11 wherein the affixing means are bolts that protrude through the diode mount and at least partially through the lens mount for fixedly positioning the diode mount and the lens mount after the laser diode and the collimator lens are aligned.

13. The athermally compensated printhead of claim 11 wherein the diode mount comprises adjusting means for aligning the laser diode with the collimator lens prior to the affixing means fixing the positions of the diode mount and the lens mount, the adjusting means comprising:

a first edge of the diode mount for moving the diode mount in an X direction by a force from an external means to align the laser diode and the collimator lens in the X direction; and a second edge of the diode mount for moving the diode mount in a Y direction orthogonal to the X direction by a force from a second external means to align the laser diode and the collimator lens in the Y direction.

14. The athermally compensated printhead of claim 13 wherein a third external means provides a force on the collimator lens to move the collimator lens in a Z direction orthogonal to the X and Y directions to effect focussing of the collimator lens in the Z direction, where the forces from the first, second, and third external means are removed once the affixing means fixes the aligned positions of the laser diode, the diode mount, and the lens mount, and the aligned and focused collimator lens is secured in the lens mount.

15. The athermally compensated printhead of claim 9 wherein the lens mount comprises:

a V-shaped groove for supporting the collimator lens; and retaining means for fixedly mounting the collimator lens in the V-shaped groove.

* * * * *